(12) United States Patent
Nishimura et al.

(10) Patent No.: US 9,213,140 B2
(45) Date of Patent: Dec. 15, 2015

(54) FIBER COMPONENT AND LASER DEVICE

(71) Applicant: Panasonic Corporation, Osaka (JP)

(72) Inventors: Hitoshi Nishimura, Osaka (JP); Hideaki Itoh, Hyogo (JP); Doukei Nagayasu, Hyogo (JP); Rintaro Nishina, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/278,269

(22) Filed: May 15, 2014

(65) Prior Publication Data

US 2014/0248023 A1    Sep. 4, 2014

Related U.S. Application Data

(63) Continuation of application No. PCT/JP2013/001347, filed on Mar. 5, 2013.

(30) Foreign Application Priority Data

Apr. 9, 2012    (JP) .................. 2012-088257

(51) Int. Cl.
*G02B 6/255*    (2006.01)
*G02B 6/42*    (2006.01)
(Continued)

(52) U.S. Cl.
CPC ............ *G02B 6/2551* (2013.01); *G02B 6/2558* (2013.01); *G02B 6/4296* (2013.01); *G02B 6/255* (2013.01); *H01S 5/02284* (2013.01); *H01S 5/4012* (2013.01)

(58) Field of Classification Search
CPC .. G02B 6/2551; G02B 6/2558; G02B 6/2553; G02B 6/255; G02B 6/2552
USPC .................. 385/15, 39, 43, 95, 96, 97, 98, 99
See application file for complete search history.

(56) References Cited

U.S. PATENT DOCUMENTS

| 4,727,237 A | 2/1988 | Schantz |
| 6,139,196 A | 10/2000 | Feth et al. |

(Continued)

FOREIGN PATENT DOCUMENTS

| JP | 58-080610 A | 5/1983 |
| JP | 63-282707 A | 11/1988 |

(Continued)

OTHER PUBLICATIONS

International Search Report for Application No. PCT/JP2013/001347 dated May 14, 2013.

(Continued)

*Primary Examiner* — Jennifer Doan
(74) *Attorney, Agent, or Firm* — Panasonic Patent Center

(57) ABSTRACT

The fiber component of the present invention has a fusion splice section for connecting optical fibers. The optical fiber as the receiver of transmitted light is coated with at least two-layer resin. In the vicinity of the fusion splice section for connecting optical fibers, the innermost layer of a resin-coat section is uncovered with other resin coat at the boundary between the resin-coat section and resin-coat removed section of the optical fiber coated with two-layer resin. The structure effectively releases light and suppresses increase in temperature of the resin-coat section, protecting the optical fibers from burn-out.

17 Claims, 9 Drawing Sheets

(51) Int. Cl.
*H01S 5/022* (2006.01)
*H01S 5/40* (2006.01)

(56) References Cited

U.S. PATENT DOCUMENTS

| | | | |
|---|---|---|---|
| 2004/0240819 A1 | 12/2004 | Shima et al. | |
| 2008/0019642 A1* | 1/2008 | Kewitsch | 385/72 |
| 2010/0188735 A1 | 7/2010 | Tamaoki | |
| 2012/0201500 A1 | 8/2012 | Murashima et al. | |
| 2013/0044986 A1* | 2/2013 | Chen et al. | 385/96 |
| 2014/0204456 A1* | 7/2014 | Chavez-Pirson et al. | 359/326 |

FOREIGN PATENT DOCUMENTS

| | | |
|---|---|---|
| JP | 01-191807 A | 8/1989 |
| JP | 2-061602 A | 3/1990 |
| JP | 2002-529784 A | 9/2002 |
| JP | 2004-037762 A | 2/2004 |
| JP | 2004-356318 A | 12/2004 |
| JP | 2005-121980 A | 5/2005 |
| JP | 2007-188000 | 7/2007 |
| JP | 2007-271786 A | 10/2007 |
| JP | 2009-115918 A | 5/2009 |
| JP | 2010-171322 A | 8/2010 |
| JP | 2011-085833 A | 4/2011 |
| JP | 2011-186399 A | 9/2011 |
| WO | 2007/080703 | 7/2007 |

OTHER PUBLICATIONS

The Extended European Search Report dated Apr. 21, 2015 for the related European Patent Application No. 13775330.7.

* cited by examiner

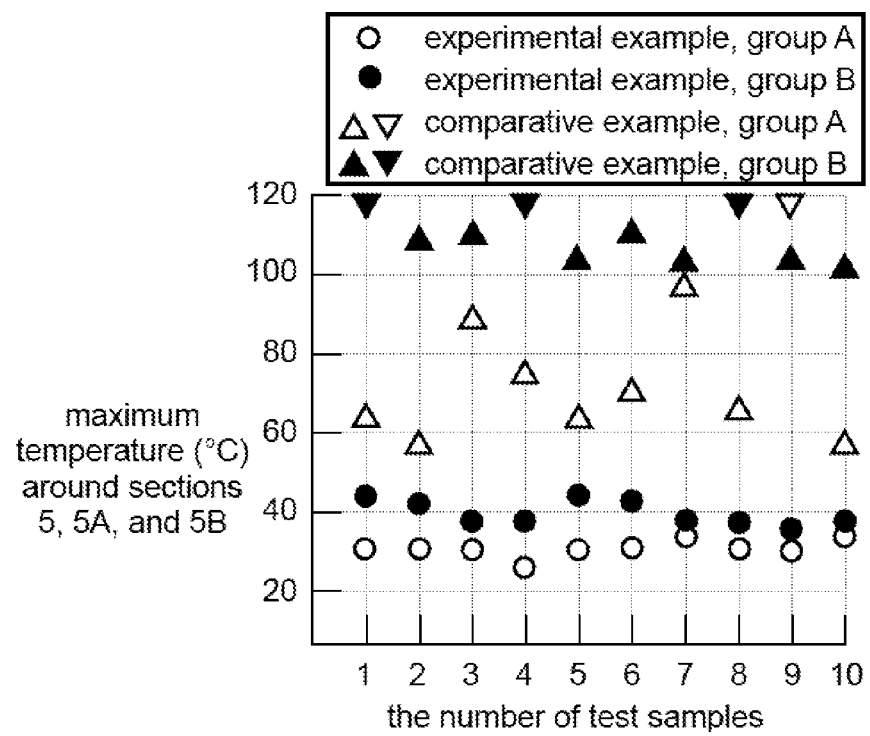
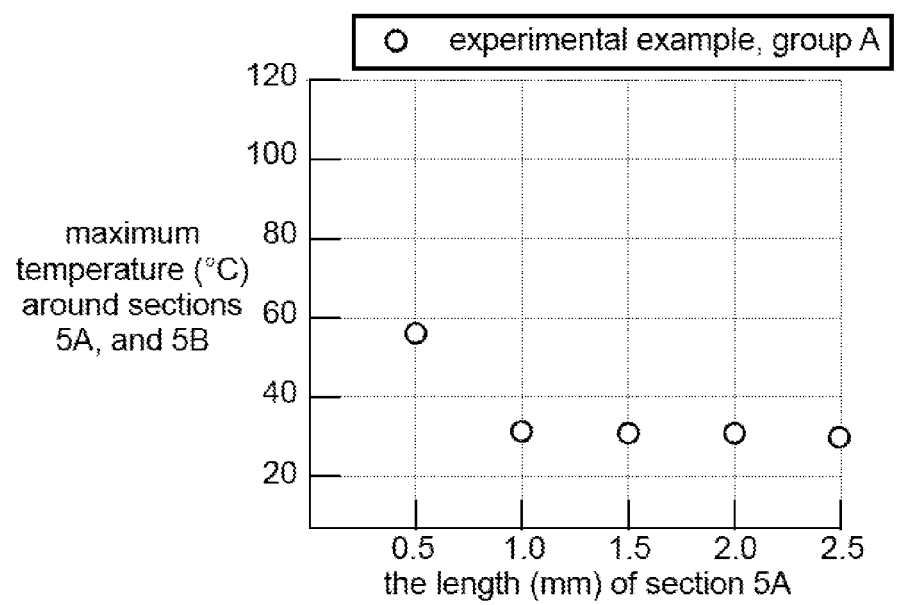

FIBER COMPONENT AND LASER DEVICE

BACKGROUND

1. Technical Field

The present invention relates to a fiber component having a splice section used for fiber laser device and laser device employing the fiber component. In particular, it relates to heat dissipation of a fiber component.

2. Background Art

Recently, laser has been used for welding from the reasons of providing less deformation and high welding speed, and also used for cutting from the reasons of providing high cutting speed and a well-finished cutting surface. Of solid-state laser capable of light guiding with optical fiber, fiber laser has rapidly become popular because of its high-power output and high quality of laser beams.

The fiber laser is mostly made of thin optical fibers with a diameter of 1 mm or less, and through which, high-power laser light travels. Due to the structure above, for example, light generated by mode conversion at a fusion splice section between optical fibers can heat the optical fiber and burn it out. As fiber laser device has increase in output, the heat generation and burn-out of optical fibers has been a big problem to be worked out.

FIG. 10A through FIG. 10D show the main structure of an ordinary optical fiber having a silica core and used for laser device. Specifically, each of FIG. 10A and FIG. 10B is a cross-sectional view, taken along a direction of light propagation, of an ordinary optical fiber having a silica core; whereas each of FIG. 10C and FIG. 10D is a cross-sectional view, taken along a direction perpendicular to light propagation, of an ordinary optical fiber having a silica core.

In FIG. 10A and FIG. 10C, core 201—through which laser light travels—is mainly made of silica and is surrounded by a resin layer. The resin layer has inner resin coat 203 and outer resin coat 204.

Core 201 shown in FIG. 10B and FIG. 10D is made of silica or silica in which an excitable medium or germanium is doped. Core 201 is surrounded by clad 202 made of silica or fluorine-doped silica. Core 201 and clad 202 have difference in refractive index. Clad 202 is surrounded by a resin layer of inner resin coat 203 and outer resin coat 204.

Other than the structures described above, there is an optical fiber having silica-based sections formed in three layers or more, but such a structure is not shown here.

Hereinafter, the structure shown in FIG. 10A and FIG. 10C is described as an example of the optical fiber. Each of FIG. 11A, FIG. 11B, and FIG. 11C is a cross-sectional view showing the structure of an ordinary optical fiber and its profile of refractive index.

The resin layers as a coat on the core, as shown in the examples of FIG. 11A through FIG. 11C, have different patterns, and the pattern depends on difference in refractive index of inner resin coat 203 and outer resin coat 204. Further, there is an optical fiber having resin coat of three-or-more layers, but such a structure is not shown here. The left part of FIG. 11A through FIG. 11C shows the profile of refractive index of each example. The refractive index increases toward the left side of the double-headed arrow.

Each of FIG. 12A, FIG. 12B, and FIG. 12C is a cross-sectional view of the structure of a conventional fiber component, showing an example of fusion splicing of a conventional optical fiber.

FIG. 12A shows fusion splice section 206 connecting a single optical fiber with another single optical fiber. An ordinary process of fusion splicing is as follows: prior to fusion splicing, the resin coat on core 201 is removed and the exposed core is cut off into a predetermined length. After that, core 201 of each optical fiber is fused and connected with each other (see Japanese Unexamined Patent Application Publication No. H01-191807, for example). Therefore, after fusion splicing, the part adjacent to fusion splice section 206 has no resin coat.

However, fusion splice section 206 with no resin coat can decrease the strength of the structure. From the reason, it is often recoated with resin, as shown in FIG. 12B. The part adjacent to fusion splice section 206—from which the resin coat has been removed for fusion splicing—is coated again with recoating resin 207 after fusion splicing (see Japanese Unexamined Patent Application Publication No. 2009-115918, for example).

To suppress heat generated by light leaked from fusion splice section 206 and the periphery of it, the structure shown in FIG. 12C has heatsink 208. Heatsink 208 converts the leaked light into heat and dissipates it to the outside. Fusion splice section 206 is covered with heatsink 208 and fixed in groove 209. Further, fusion splice section 206 is recoated with recoating resin 207 of a resin material that transmits the light leaked from fusion splice section 206 (see Japanese Unexamined Patent Application Publication No. 2007-271786, for example.).

According to the prior-art measures against heat generation described above, fusion splice section 206 has to be coated with recoating resin.

In some fiber components, however, resin recoating can cause burn-out due to considerable leakage of light from fusion splice section 206 of the optical fiber, and therefore, recoating process cannot be employed for such a component.

When light fails to escape from the resin recoating section, the light can leak into a resin coat and generates heat in the resin coat. This can cause burn-out of an optical fiber.

SUMMARY

The present invention provides a fiber component, with no use of recoating resin, capable of suppressing heat generation in a resin coat and eliminating burn-out. The present invention also provides laser device employing the fiber component.

The fiber component of the present invention has the structure having a fusion splice section for connecting optical fibers. The fiber component has a first optical fiber, a second optical fiber, and a fusion splice section. The first optical fiber transmits light and includes first core. The second optical fiber receives the light and includes a second core, a first inner resin coat and a first outer resin coat. The first inner resin coat covers the second core and has a refractive index lower than refractive index in the second core. The first outer resin coat covers the first inner resin coat. The fusion splice section connects the first optical fiber with the second optical fiber. According to the structure of the fiber component of the present invention, an area adjacent to the fusion splice section contains a resin-coat removed section in which the first outer resin coat and the first inner resin coat of the second optical fiber are removed. An area adjacent to the resin-coat removed section contains a boundary section in which the first outer resin coat of the second optical fiber is removed and the first inner resin coat is exposed to outside. The first core has a cross-sectional area tapering toward the fusion splice section.

The structure above effectively releases light to be the cause of heat generation and suppresses increase in temperature of the resin coat, protecting the optical fibers from burn-out.

The laser device of the present invention has a structure employing the fiber component described above.

The structure effectively releases light to be the cause of heat generation and suppresses increase in temperature of the resin coat, protecting the optical fibers from burn-out. The structure provides the laser device with high reliability

BRIEF DESCRIPTION OF THE DRAWINGS

FIG. 8A is a graph showing measurement results of temperature in the experimental example of the present invention.

FIG. 8B is a graph showing measurement results of temperature in the experimental example of the present invention.

DETAILED DESCRIPTION OF THE PREFERRED EMBODIMENTS

Figure 1:
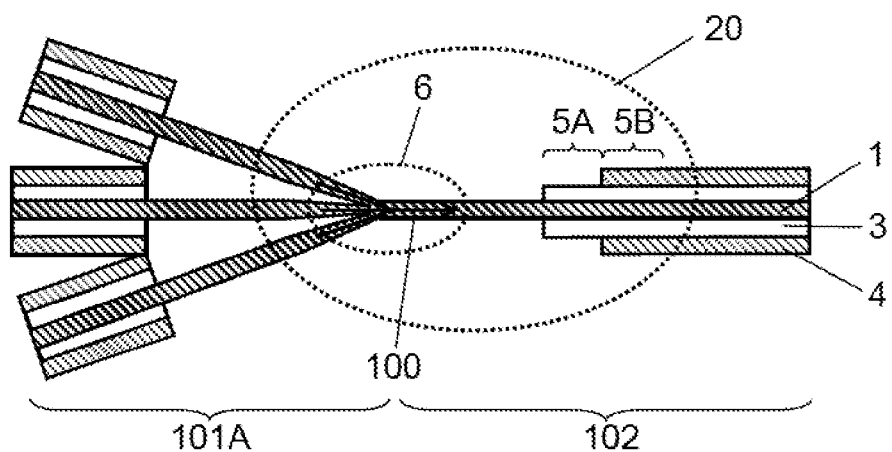
FIG. 1 is a cross-sectional view showing the structure of a fiber component in accordance with a first exemplary embodiment of the present invention.

Hereinafter, exemplary embodiments of the present invention are described with reference to accompanying drawings. In the drawings, like components have the same reference marks and the descriptions thereof may be omitted.

First Exemplary Embodiment

Figure 2:
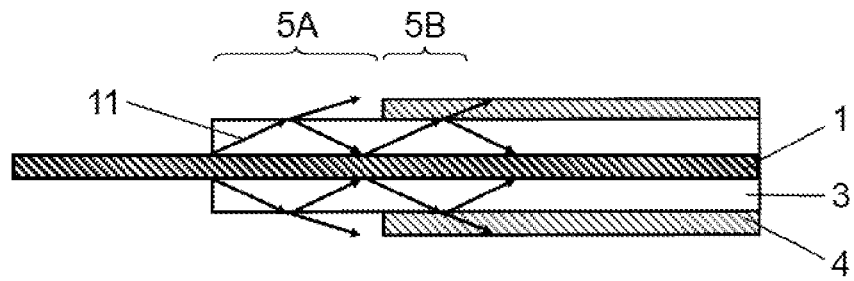
FIG. 2 is a cross-sectional view showing light propagation in the fiber component in accordance with the first exemplary embodiment of the present invention.
Figure 3A:
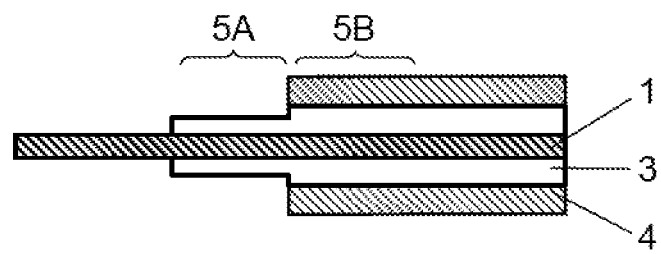
FIG. 3A is a cross-sectional view showing the shape of an optical fiber of the fiber component in accordance with the first exemplary embodiment of the present invention.
Figure 3B:
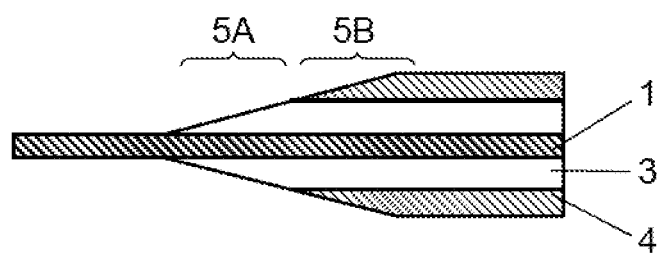
FIG. 3B is a cross-sectional view showing another shape of an optical fiber of the fiber component in accordance with the first exemplary embodiment of the present invention.

FIG. 1 is a cross-sectional view showing the structure of a fiber component in accordance with the first exemplary embodiment of the present invention. FIG. 2 is a cross-sectional view showing light propagation in the fiber component in accordance with the first exemplary embodiment of the present invention. Each of FIG. 3A and FIG. 3B is a cross-sectional view showing the shape of the optical fiber of the fiber component in accordance with the first exemplary embodiment of the present invention.

As shown in FIG. 1, the fiber component of the first embodiment has a plurality of optical fibers 101A (hereinafter, referred to as first optical fiber 101A) as the sender of light 100, and single optical fiber 102 with two-layer coat (hereinafter, referred to as second optical fiber 102) as the receiver of light 100. First optical fiber 101A is connected with second optical fiber 102 at fusion splice section 6. According to the structure above, to obtain high-power laser light, light 100 emitted from a plurality of laser sources are carried through a plurality of optical fibers and guided into a single optical fiber (for example, second optical fiber 102).

As shown in FIG. 1, first optical fiber 101A is connected with second optical fiber 102 at fusion splice section 6. Second optical fiber 102 has core 1 through which light 100 travels, and two-layer resin coat formed of inner resin coat 3 and outer resin coat 4.

In the vicinity of fusion splice section 6 in area 20, the two-layer resin coat, i.e., inner resin coat 3 and outer resin coat 4 are both removed. The resin-coat removed section is followed by inner-resin-coat exposed section 5A (hereinafter, exposed section 5A) where inner resin coat 3 is not covered with outer resin coat 4 for a predetermined length. Further, exposed section 5A is followed by outer resin-coat end 5B at which the outer resin coat appears.

The fiber component having the structure above will be described.

Figure 11A:
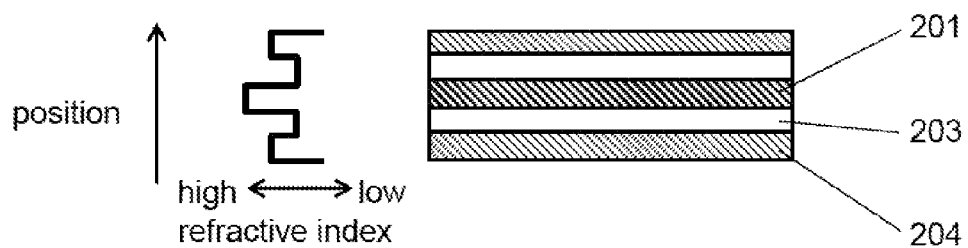
FIG. 11A shows a cross-sectional view of the structure of an ordinary optical fiber, and shows profile of refractive index of the structure.
Figure 11B:
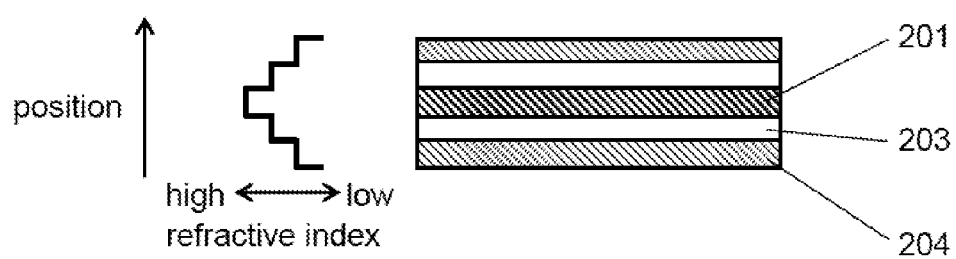
FIG. 11B shows a cross-sectional view of the structure of an ordinary optical fiber, and shows profile of refractive index of the structure.
Figure 11C:
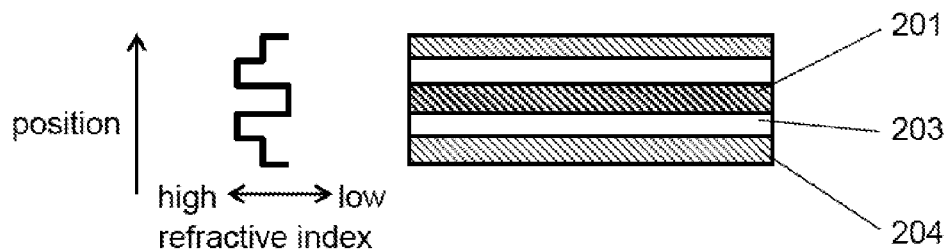
FIG. 11C shows a cross-sectional view of the structure of an ordinary optical fiber, and shows profile of refractive index of the structure.
Figure 12A:
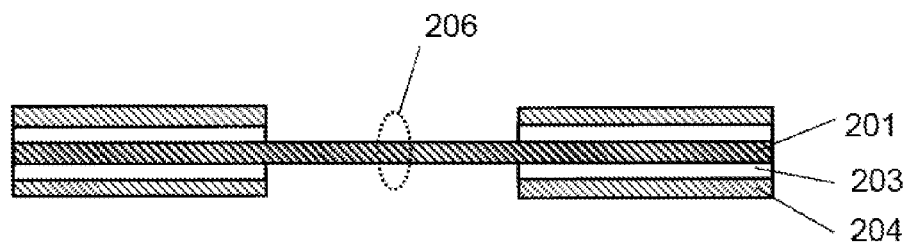
FIG. 12A is a cross-sectional view of the structure of a conventional fiber component.
Figure 12B:
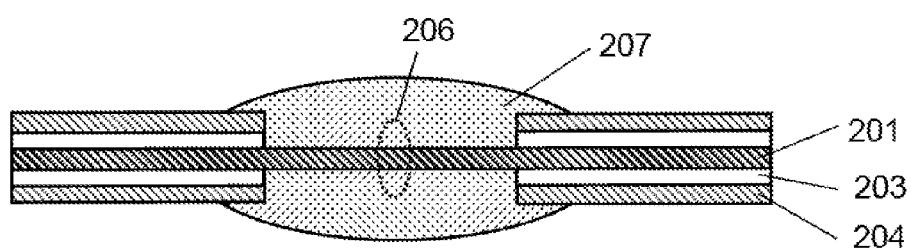
FIG. 12B is a cross-sectional view of the structure of a conventional fiber component.
Figure 12C:
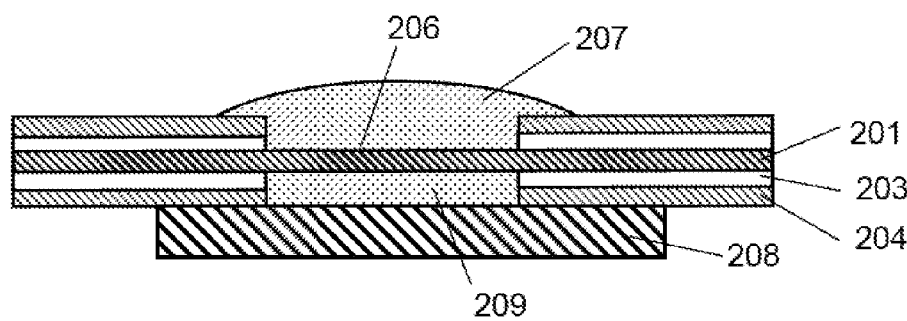
FIG. 12C is a cross-sectional view of the structure of a conventional fiber component.

First optical fiber 101A have a plurality of optical fibers, whereas second optical fiber 102 is a single fiber coated with two-layer resin. Light 100 travels from first optical fiber 101A to second optical fiber 102. Second optical fiber 102 is made of material having the profile of refractive index shown in FIG. 11B. In second optical fiber 102 having the profile of refractive index of FIG. 11B, the refractive index of inner resin coat 3 is smaller than that of core 1. With the structure above, most of the light in core 1 has total reflection at the interface while traveling through core 1. This maintains transmitting efficiency high.

However, if a disturbance occurs in the light transmission at fusion splice section 6, an amount of the light can escape from core 1. In the optical fiber having the profile of refractive index shown in FIG. 11B, the light leaked from core 1 mainly travels through inner resin coat 3. At that time, the resin absorbs the light and generates heat, which can cause burn-out.

First optical fiber 101A (located on the left side of fusion splice section 6 in FIG. 1) has core 1 with a diameter of approximately 105 μm, and second optical fiber 102 (located on the right side) has core 1 with a diameter of 200 μm. As shown in FIG. 1, first optical fiber 101A is formed of a plurality of optical fibers and the core of each fiber tapers down toward fusion splice section 6. The diameter of core 1 of first optical fiber 101A is decreased in response to increase in number of optical fibers of first optical fiber 101A to be connected with second optical fiber 102. For example, for seven optical fibers, the diameter of core 1 of each fiber of first optical fiber 101A is decreased to approximately 67 μm or less; for three fibers, the diameter is decreased to approximately 93 μm or less; for 19 fibers, the diameter is decreased to approximately 40 μm or less; and for 37 fibers, the diameter is decreased to approximately 29 μm or less.

The diameter of core 1 of each first optical fiber 101A at fusion splice section 6 is determined to be suitable for the diameter of core 1 of second optical fiber 102. The following is a preferable relation between the number of first optical fiber 101A at fusion splice section 6 and the ratio of the diameter of core 1 of first optical fiber 101A to the diameter of core 1 of second optical fiber 102 (hereinafter, diameter ratio).

For three fibers of first optical fiber 101A, a diameter ratio is preferably 46% or less; for four fibers, 41% or less; for seven fibers, 33% or less; for 19 fibers, 20% or less; for 37 fibers, 14% or less; for 61 fibers, 11% or less; and for 91 fibers, 9% or less.

FIG. 2 is a cross-sectional view of second optical fiber 102, showing propagation of light 11 leaked at exposed section 5A of second optical fiber 102. If light 100 undergoes a disturbance at fusion splice section 6, an amount of light 11 escapes from core 1 into inner resin coat 3 at exposed section 5A where inner resin coat 3 is not covered with outer resin coat 4.

Most of light 11 easily concentrates at a part where difference in refractive index on the interface of core 1, i.e., the part on which inner resin coat 3 appears on core 1. However, according to the structure having exposed section 5A as a distinctive feature of the first exemplary embodiment, light 11 partly escapes from inner resin coat 3 to the outside. By virtue of that, the light traveling in inner resin coat 3 decreases by the escaped amount of light 11. That is, the light to be absorbed in inner resin coat 3 decreases by the amount of light 11, which suppresses heat generation in the resin section including inner resin coat 3.

Besides, at outer resin-coat end 5B, an amount of the light may escape from inner resin coat 3 to outer resin coat 4. However, as described above, the light traveling in inner resin coat 3 decreases, and accordingly, light leakage into outer resin coat 4 is suppressed.

By virtue of the effective release of light, light 11—to be absorbed in outer resin coat 4 and then converted into heat—decreases, by which temperature rise due to heat generation is suppressed in the resin section.

Exposed section 5A, as described above, has no outer resin coat 4 over inner resin coat 3. Even when exposed section 5A has inner resin coat 3 with a small thickness, as shown in FIG. 3A, the similar effect is obtained. Second optical fiber 102 having the structure shown in FIG. 3A can be obtained by removing outer resin coat 4 completely to such an extent that an amount of inner resin coat 3 is removed together.

Further, second optical fiber 102 may be formed into the structure shown in FIG. 3B. In the structure, outer resin coat 4 is removed so that the resin-coat section (of outer resin coat 4 and inner resin coat 3) is formed into a tapered shape. The structure offers the similar effect as long as inner resin coat 3 has a part without outer resin coat 4 thereon. The structure of FIG. 3B has following advantages:

- the resin-coat removing work to form exposed section 5A is easy
- the length of exposed section 5A is flexibly determined by the gradient of the tapered shape;
- the tapered tip of inner resin coat 3 has a very intimate contact with core 1, and the tapered shape prevents light 11 from concentrating at a certain area.

The fiber component of the embodiment of the present invention has the structure with fusion splice section 6 for connecting optical fibers. The fiber component has first optical fiber 101A, second optical fiber 102, and fusion splice section 6. First optical fiber 101A is the optical fiber as the sender of light 100, while second optical fiber 102 is the optical fiber as the receiver of light 100. Second optical fiber 102 is coated with the resin-coat section formed of at least two-layer resin. Fusion splice section 6 connects first optical fiber 101A with second optical fiber 102. According to the structure of the fiber component of the embodiment, in area 20 adjacent to fusion splice section 6, the innermost layer of the resin-coat section is exposed (i.e., the innermost layer has no other resin coat) at the boundary between the resin-coat section and the resin-coat removed section where the resin-coat section of the second optical fiber is removed.

The structure above effectively releases light 11 to be the cause of heat generation and suppresses increase in temperature of the resin-coat section, protecting the optical fibers from burn-out.

Besides, at least any one of first optical fiber 101A and second optical fiber 102 may have a structure of bundles of optical fibers. With the structure having a plurality of optical fibers, high-power laser output is obtained.

Further, the fiber component may be formed into a structure in which the outside of the innermost resin layer at the boundary has a tapered cross-section. The structure above not only allows exposed section 5A to have a flexibly determined length but also prevents light 11 (leaked from core 1) from concentrating at a certain area.

After the component with the structure above is completed, a protective member such as a hollow glass tube (not shown) may be disposed to fusion splice section 6 for protection. Instead of using recoating resin, adding a protective member to the structure also provides the component with strength. Thus, the structure protects the optical fiber from heat generation, having no worry of damage by recoating.

Second Exemplary Embodiment

Figure 4:
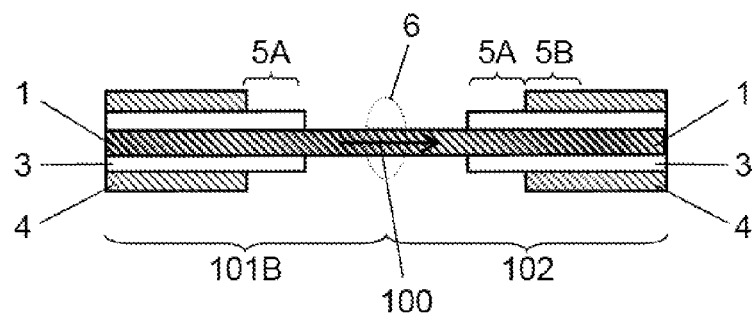
FIG. 4 is a cross-sectional view showing the structure of a fiber component in accordance with a second exemplary embodiment of the present invention.

FIG. 4 is a cross-sectional view showing the structure of a fiber component in accordance with the second exemplary embodiment of the present invention. The structure of the embodiment will be described as an example of fusion splicing between a single optical fiber as the sender of light 100 and a single optical fiber as the receiver of light 100.

As shown in FIG. 4, each of first optical fiber 101B and second optical fiber 102 is a single optical fiber having two-layer coat thereon. First optical fiber 101B (as the sender of light 100) is connected with the second optical fiber 102 (as the receiver of light 100) at fusion splice section 6. Light 100 travels from first optical fiber 101B to second optical fiber 102. Second optical fiber 102 has core 1 thorough which light 100 travels, inner resin coat 3, and outer resin coat 4.

In the vicinity of fusion splice section 6, inner resin coat 3 and outer resin coat 4 are both removed. The resin-coat removed section is followed by exposed section 5A where inner resin coat 3 is not covered with outer resin coat. 4 for a predetermined length. Exposed section 5A is disposed in each of first optical fiber 101B and second optical fiber 102. Further, exposed section 5A is followed by outer resin-coat end 5B at which outer resin coat 4 appears.

Such structured fiber component will be described.

Light 100 travels from first optical fiber 101B to second optical fiber 102. Like the structure described in the previous first embodiment, second optical fiber 102 of the second embodiment is made of material having the profile of refractive index shown in FIG. 11B.

If a disturbance occurs in the light transmission of light 100 at fusion splice section 6, an amount of light 100 can escape from core 1. In the optical fiber having the profile of refractive index shown in FIG. 11B, light 11 leaked from core 1 mainly travels through inner resin coat 3. At that time, the resin absorbs the light and generates heat, which can cause burn-out.

Like in the first embodiment, the structure of the second embodiment has exposed section 5A. As shown in FIG. 2, light 11 partly escapes from inner resin coat 3 to the outside. By virtue of that, the light traveling in inner resin coat 3 decreases by the escaped amount of light 11. That is, the light to be absorbed in inner resin coat 3 decreases by the escaped amount of light 11, which suppresses heat generation in the resin-coat section.

Besides, at outer resin-coat end 5B, an amount of light 11 may escapes from inner resin coat 3 to outer resin coat 4. However, as described above, the light traveling in inner resin coat 3 decreases, and accordingly, light leakage into outer resin coat 4 is suppressed.

The fiber component of the second exemplary embodiment is a fiber component having fusion splice section 6 for connecting optical fibers. The component has first optical fiber 101B, second optical fiber 102, and fusion splice section 6. First optical fiber 101B is the optical fiber as the sender of light 100, while second optical fiber 102 is the optical fiber as the receiver of light 100. Second optical fiber 102 is coated with a resin-coat section formed of at least two-layer resin. Fusion splice section 6 connects first optical fiber 101B with second optical fiber 102. According to the structure of the fiber component of the second exemplary embodiment of the present invention, in area 20 adjacent to fusion splice section 6, the innermost layer of the resin-coat section is exposed (i.e., the innermost layer has no other resin coat) at the boundary between the resin-coat section and the resin-coat removed section where the resin-coat section of second optical fiber 102 is removed.

The structure above effectively releases light 11 to be the cause of heat generation and suppresses increase in temperature of the resin-coat section, protecting the optical fibers from burn-out.

By virtue of the effective release of light, light 11—to be absorbed in outer resin coat 4 and then converted into heat—decreases, by which temperature rise due to heat generation is suppressed in the resin-coat section.

Exposed section 5A, as described above, has no outer resin coat 4 over inner resin coat 3. Even when exposed section 5A has inner resin coat 3 with a small thickness, as shown in FIG. 3A, the similar effect is obtained. Second optical fiber 102 having the structure shown in FIG. 3A can be obtained by removing outer resin coat 4 completely to such an extent that an amount of inner resin coat 3 is removed together.

Further, second optical fiber 102 may be formed into the structure shown in FIG. 3B. In the structure, outer resin coat 4 is removed so that outer resin coat 4 and inner resin coat 3 are formed into a tapered shape. The structure offers the similar effect as long as inner resin coat 3 has a part without outer resin coat 4 thereon. The structure of FIG. 3B has following advantages:

the resin-coat removing work to form exposed section 5A is easy;

the length of exposed section 5A is flexibly determined by the gradient of the tapered shape;

the tapered tip of inner resin coat 3 has a very intimate contact with core 1, and the tapered shape prevents light 11 from concentrating at a certain area.

Third Exemplary Embodiment

Figure 5:
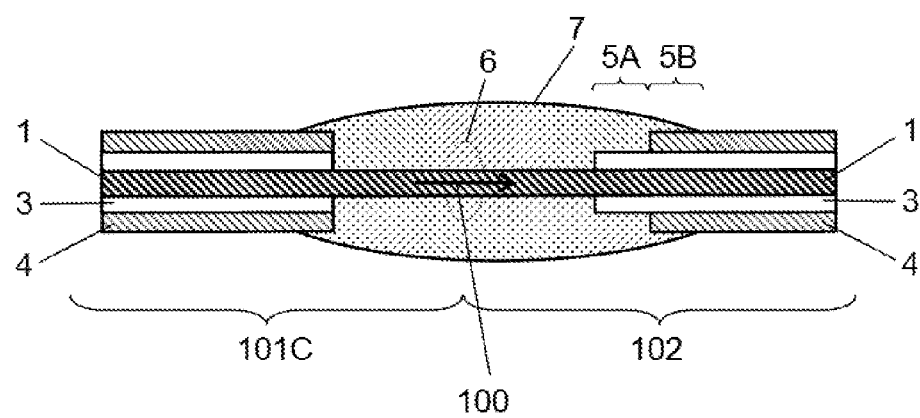
FIG. 5 is a cross-sectional view showing the structure of a fiber component in accordance with a third exemplary embodiment of the present invention.

FIG. 5 is a cross-sectional view showing the structure of a fiber component in accordance with the third exemplary embodiment of the present invention. The structure of the embodiment will be described as an example of fusion splicing between a single optical fiber as the sender of light 100 and a single optical fiber as the receiver. In the structure, fusion splice section 6 and its vicinity are recoated with resin.

As shown in FIG. 5, first optical fiber 101C is a single optical fiber for sending light 100 as the sender, and second optical fiber 102 is a single optical fiber for receiving light 100 as the receiver. Second optical fiber 102 has two-layer coat thereon. First optical fiber 101C is connected with the second optical fiber 102 at fusion splice section 6. Light 100 travels from first optical fiber 101C to second optical fiber 102. Second optical fiber 102 has core 1 thorough which light 100 travels, inner resin coat 3, and outer resin coat 4.

In the vicinity of fusion splice section 6 of each of first optical fiber 101C and second optical fiber 102, resin coat 3 and resin coat 4 are both removed. Exposed section 5A, in which inner resin coat 3 is not covered with outer resin coat 4 for a predetermined length, is disposed on second optical fiber 102. Further, exposed section 5A is followed by outer resin-coat end 5B at which outer resin coat 4 appears.

According to the structure of the third exemplary embodiment, as shown in FIG. 5, at least the resin-coat removed section in the vicinity of fusion splice section 6 is recoated with recoat resin 7.

Such structured fiber component will be described.

Light 100 travels from first optical fiber 101C as the sender to second optical fiber 102. Like the structures described in the first and the second embodiments, second optical fiber 102 of the embodiment is made of material having the profile of refractive index shown in FIG. 11B.

If a disturbance occurs in the light transmission of light 100 at fusion splice section 6, an amount of light 100 can leak from core 1. According to the structure of the third embodiment, the leaked light (i.e. light 11)—as the result of having a change in condition at fusion splice section 6—mostly escapes through recoat resin 7 to the outside as scattering light. However, an amount of light 11 travels through inner resin coat 3. At that time, the resin absorbs the light and generates heat, which can cause burn-out.

Like in the second embodiment, the structure of the third embodiment has exposed section 5A. As shown in FIG. 2, light 11 partly escapes from inner resin coat 3 to the outside. By virtue of that, the light traveling in inner resin coat 3 decreases by the escaped amount of light 11. That is, the light to be absorbed in resin coat 3 decreases by the escaped amount of light 11, which suppresses temperature rise in the resin-coat section caused by heat generation.

Besides, at outer resin-coat end 5B, an amount of light 11 may escapes from inner resin coat 3 to outer resin coat 4.

However, as described above, the light traveling in inner resin coat 3 decreases, and accordingly, light leakage into outer resin coat 4 is suppressed.

The fiber component of the third exemplary embodiment is a fiber component having fusion splice section 6 for connecting optical fibers. The component has first optical fiber 101C, second optical fiber 102, and fusion splice section 6. First optical fiber 101C is the optical fiber as the sender for sending light 100, while second optical fiber 102 is the optical fiber as the receiver for receiving light 100. Second optical fiber 102 is coated with a resin-coat section formed of at least two-layer resin. Fusion splice section 6 connects first optical fiber 101C with second optical fiber 102. According to the structure of the fiber component of the third exemplary embodiment of the present invention, in area 20 adjacent to fusion splice section 6, the innermost layer of the resin-coat section is exposed (i.e., the innermost layer has no other resin coat thereon) at the boundary between the resin-coat section and the resin-coat removed section where the resin-coat section of second optical fiber 102 is removed.

The structure above effectively releases light 11 to be the cause of heat generation and suppresses increase in temperature of the resin-coat section, protecting the optical fibers from burn-out.

Like in the first and the second embodiments, the structure having recoat resin 7 offers the similar effect. That is, by virtue of the effective release of light, light 11—to be absorbed in outer resin coat 4 and then converted into heat—decreases, by which temperature rise due to heat generation is suppressed in the resin section.

Exposed section 5A, as described above, has no outer resin coat 4 over inner resin coat 3. Even when exposed section 5A has inner resin coat 3 with a small thickness, as shown in FIG. 3A, the similar effect is obtained. Second optical fiber 102 having the structure shown in FIG. 3A can be obtained by removing outer coat 4 completely to such an extent that an amount of inner resin coat 3 is removed together.

Further, second optical fiber 102 may be formed into the structure shown in FIG. 3B. In the structure, outer resin coat 4 is removed so that the resin section (of outer resin coat 4 and inner resin coat 3) is formed into a tapered shape. The structure offers the similar effect as long as inner resin coat 3 has a part without outer resin coat 4 thereon. The structure of FIG. 3B has following advantages;

the resin-coat removing work to form exposed section 5A is easy;

the length of exposed section 5A is flexibly determined by the gradient of the tapered shape;

the tapered tip of inner resin coat 3 has a very intimate contact with core 1, and the tapered shape prevents light 11 from concentrating at a certain area.

EXAMPLE 1

Figure 6:
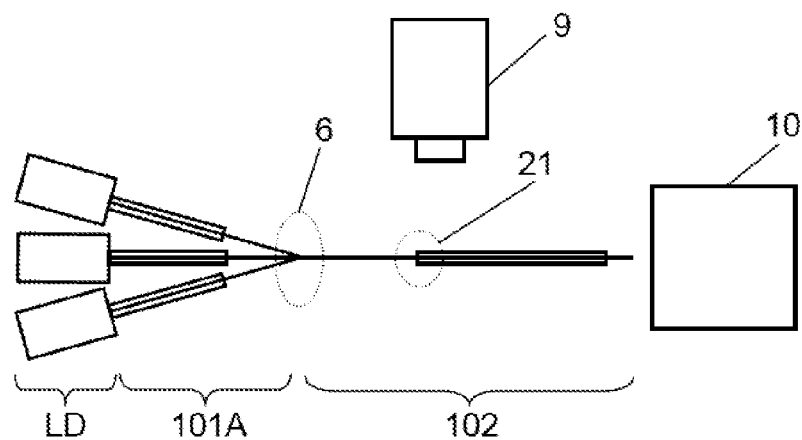
FIG. 6 is a plan view showing the structure of the measurement system of an experimental example of the present invention.
Figure 7:
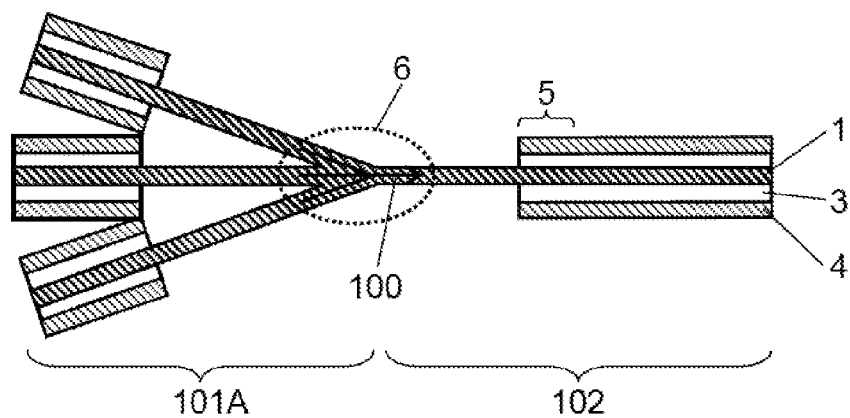
FIG. 7 is a cross-sectional view showing the structure of a conventional fiber component as a comparative example to the experimental example of the present invention.

Next, an experimental example of the fiber components described in the first through the third embodiments are specifically described. FIG. 6 is a plan view showing the structure of the measurement system of the experimental example of the present invention. FIG. 7 is a cross-sectional view showing the structure of a conventional fiber component as a comparative example to the experimental example of the present invention. Each of FIG. 8A and FIG. 8B is a graph showing measurement results of temperature in the experimental example of the present invention.

The inventor prepared an example of the fiber component of FIG. 1 described in the first exemplary embodiment and a comparative example shown in FIG. 7. The comparative example has the same structure—except for having no exposed section 5A—as that of FIG. 1. The inventor carried out temperature measurement of the prepared two examples under the following conditions to demonstrate the effect of the example of the fiber component.

Laser diode LD (not shown in FIG. 1) is shown in FIG. 6. Fusion splice section 6 of first optical fiber 101A of FIG. 6 is enlarged in FIG. 1.

First optical fiber 101A shown in FIG. 1 and FIG. 7, which is the sender of light 100, is formed of a plurality of optical fibers. In the experiment, first optical fiber 101A was formed of seven optical fibers, and the fiber had a clad of 125 μm diameter (including core 1 of approximately 105 μm diameter). A numerical aperture (NA) formed between core 1 and the clad measured 0.15.

On the other hand, second optical fiber 102 as the receiver of light 100 shown in FIG. 1 and FIG. 7 was a single optical fiber having two-layer coat thereon. The diameter of core 1 was 250 μm. Core 1 and inner resin coat 3 had an NA of 0.46 therebetween.

The length of exposed section 5A shown in FIG. 1 was determined to, for example, 2 mm. The comparative example shown in FIG. 7 had no exposed section 5A.

First optical fiber 101A as the seven sender fibers were collectively processed by hot stretching, and connected with second optical fiber 102 (as the receiver of light 100) by fusion splicing. In this way, the inventor produced a plurality of experimental samples of the fiber components shown in the experimental example and the comparative example.

FIG. 6 shows the structure of the measurement system used for the experiment.

Prior to the temperature measurement, to calculate transmittance of laser light, the inventor measured the laser light that was put into first optical fiber 101A and fed out of second optical fiber 102, with use of power meter 10. After that, for each of the experimental examples and the comparative examples, the samples were grouped into two according to the calculated transmittance.

A transmittance as close to 100% as possible is ideal for connection of optical fibers; practically, a connecting condition can cause a disturbance in light transmission, decreasing transmittance. Temperature measurement was carried out for the following two groups: one is group A having transmittance not less than 97% and not more than 98%, and the other is group B having transmittance not le than 94% and not more than 95%. For each group, the inventor selected ten samples of the fiber components from each of the experimental example and the comparative example, and carried out temperature measurement on 40 fiber components in total.

The temperature measurement was carried out in a laboratory air-conditioned at 20 degrees C. The fiber components were placed so as not to be exposed to air flow. Laser light with a total amount of 80 W was fed into first optical fiber 101A. In the vicinity of resin-coat end 5, exposed section 5A or outer resin-coat end 5B (none of them shown) disposed in area 21 in FIG. 6, the maximum temperature was measured with infrared thermography 9 made by Nippon Avionics Co., Ltd.

Because the maximum-temperature area is unidentified, if the area is small, the maximum temperature can be measured lower than it really is according to the resolution power of infrared thermography 9. Considering above, the inventor determined the distance between the fiber component and the infrared thermography at substantially constant (approx. 15 cm).

The measurement results are shown in the graph of FIG. 8A. The results of group A and group B of the experimental examples are represented by a white circle and a black circle, respectively. Similarly, the results of group A and group B of the comparative examples are represented by a white triangle and a black triangle, respectively.

In both the experimental examples and the comparative examples, group B—since having transmittance lower than that of group A—exhibited maximum temperatures higher than that of group A. However, group A and group B of the experimental examples exhibited maximum temperatures lower than those of the comparative examples. As is apparent from the results, the fiber component samples of the experimental example efficiently released leaked light 11 as the cause of heat generation, offering noticeable effect on suppressing temperature rise of the resin-coat section.

In some fiber components of the comparative example, the maximum-temperature area was identified as a small spot. In such a spot, four samples (one in group A and three in group B) burnt out and failed in measurement of maximum temperature. In the graph, the inverted triangles plotted on the line of 120° C. show the burnt-out samples and therefore no measurement results.

The measurement results above show that leaked light 11 (as a part of laser light having a change in state at fusion splice section 6) tends to concentrate at a part from which inner resin coat 3 appears on core 1. Besides, in the comparative example, it seems that variations in state cause the result measured as maximum temperature concentrated at a small spot.

Further, the structure with exposed section 5A as the distinctive feature of the present invention allows light 100 to partly escape from inner resin coat 3, suppressing generation of a small spot at which the maximum temperature is measured. As a result, the structure of the present invention minimizes a temperature rise with variations considerably suppressed.

EXAMPLE 2

Next, the inventor demonstrated the effect of the fiber component samples, using the same structure of group A except for the length of exposed section 5A.

The samples of example 2 were the same as those of example 1 in the producing method, the experimental conditions, and the measurement system. The samples of example 2 differed from those of example 1 in that the length of exposed section 5A was determined as a parameter. The samples were produced so as to have difference in length of exposed section 5A ranging from approximately 0.5 mm to approximately 2.5 mm with an increment of approximately 0.5 mm. The accuracy of length of exposed section 5A was measured with a microscope made by KEYENCE CORPORATION, and the length accuracy was ±0.2 mm.

Using ten samples for each length of exposed section 5A with a difference by 0.5 mm, the inventor measured the maximum temperature and plotted the average in the graph of FIG. 8B.

As shown in FIG. 8B, even the fiber component samples with a minimum length of exposed section 5A of 0.5 mm had no burn-out, and further, they had an average of the maximum temperature at least 10° C.-lower than 70° C. that was the average of the samples with no burn-out in group A of the comparative example of example 1. As is apparent from the results, the fiber component samples of the example efficiently released leaked light 11 that would be the cause of heat generation, offering noticeable effect on suppressing temperature rise in the resin-coat section.

Further, as shown in FIG. 8B the effect was obvious in the component samples with a length of exposed section 5A of 1.0 mm or more. They had an average of the maximum temperature lower than the samples with a length of exposed section 5A of 0.5 mm by at least 20° C. Besides, the component samples maintained the temperature at a level 10° C.-higher than the room temperature, offering stable effect.

As described above, the experiment proved that the structure having an exposed part—where the innermost resin of resin-coat section were not covered with the outer resin coat—protected optical fibers from burn-out.

Further, the experiment also proved that the effect was obvious by forming the exposed part so as to have a length of 1 mm or more.

Figure 9:
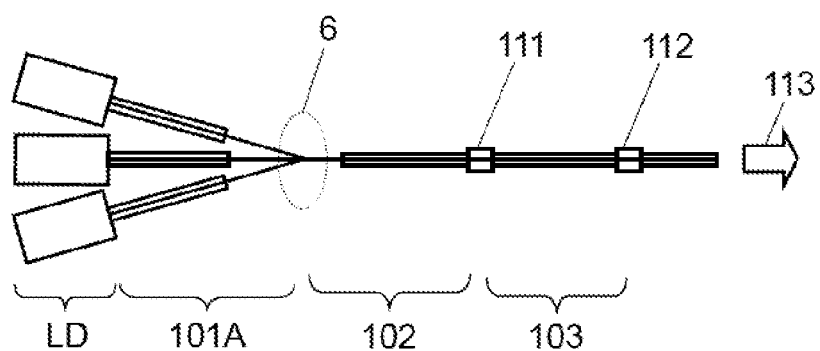
FIG. 9 is a schematic block diagram showing an example of laser device that employs the fiber components described in the first through the third exemplary embodiments of the present invention.
Figure 10A:
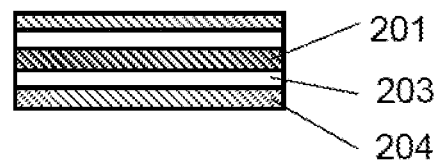
FIG. 10A is a cross-sectional view, taken along the direction of light propagation, of the structure of an ordinary optical fiber having a silica core.
Figure 10C:
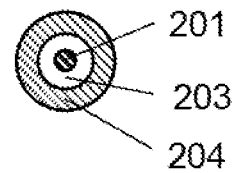
FIG. 10C is a cross-sectional view, taken along the direction perpendicular to light propagation, of the structure of an ordinary optical fiber having a silica core.
Figure 10B:
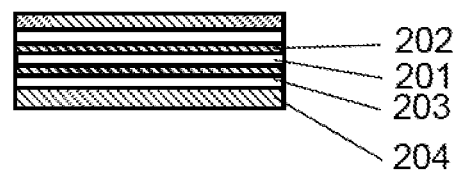
FIG. 10B is a cross-sectional view, taken along the direction of light propagation, of the structure of an ordinary optical fiber having a silica core.
Figure 10D:
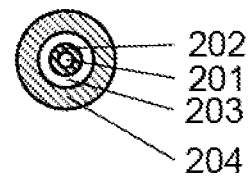
FIG. 10D is a cross-sectional view, taken along the direction perpendicular to light propagation, of the structure of an ordinary optical fiber having a silica core.

FIG. 9 is a schematic block diagram showing an example of laser device 110 that employs the fiber components described in the first through the third exemplary embodiments of the present invention. The structure, as shown in FIG. 9, has a plurality of first optical fibers 101A that receive laser light from laser diode LD. First optical fibers 101A and second optical fiber 102 are connected by fusion splice section 6. Second optical fiber 102 is connected to oscillation fiber 103 via fiber bragg grating 111. Oscillation fiber 103, and fiber bragg gratings 111, 112 (that are connected to the both ends of oscillation fiber 103) form a laser resonator. With the structure above, laser device 110 outputs high-power laser 113 oscillated at oscillation fiber 103.

Oscillation fiber 103 is a fiber having a cross section formed by a clad with a diameter of 200 µm having a core with a diameter of 10 µm at the center. The core is formed of ytterbium (Yb)-doped material. With the Yb-doped core, laser is further excited by energy received from the outside.

Laser device 110 of the present invention may contain any one of the fiber components described in the first through the third exemplary embodiments. The structure effectively releases leaked light 11 to be the cause of heat generation and suppresses increase in temperature in the resin-coat section, protecting the optical fibers from burn-out. As a result, the structure provides laser device 110 with safety and reliability.

The fiber component and the laser device having the fiber component of the present invention offer high output power with no burn-out of fibers. Such a safe and secure structure is useful for high output laser device.

What is claimed is:

1. A fiber component having a fusion splice section for connecting optical fibers, comprising:
   a first optical fiber for transmitting light including a first core;
   a second optical fiber for receiving the light including:
      a second core;
      a first inner resin coat for covering the second core, having a refractive index lower than refractive index of the second core; and
      a first outer resin coat for covering the first inner resin coat; and
   a fusion splice section for connecting the first optical fiber with the second optical fiber,
   wherein, in an area adjacent to the fusion splice section contains a resin-coat removed section in which the first outer resin coat and the first inner resin coat of the second optical fiber are removed,
   an area adjacent to the resin-coat removed section contains a boundary section in which the first outer resin coat of the second optical fiber is removed and the first inner resin coat is exposed to outside, and
   the first core has a cross-sectional area tapering toward the fusion splice section.

2. The fiber component according to claim 1, wherein the first optical fiber contains two-or-more optical fibers.

3. The fiber component according to claim 1, wherein a protective member for protecting the fusion splice section is disposed.

4. A laser device employing the fiber component according to claim 1.

5. A laser device employing the fiber component according to claim 2.

6. A laser device employing the fiber component according to claim 1.

7. A laser device employing the fiber component according to claim 3.

8. The fiber component according to claim 1, wherein the first optical fiber further includes:
- a second inner resin coat for covering the first core, having a refractive index lower than refractive index of the first core; and
- a second outer resin coat for covering the second inner resin coat, and an area adjacent to the fusion splice section contains a second resin-coat removed section in which the second outer resin coat and the second inner resin coat of the first optical fiber are removed.

9. A laser device employing the fiber component according to claim 8.

10. The fiber component according to claim 2, wherein the first optical fiber further includes:
- a second inner resin coat for covering the first core, having a refractive index lower than refractive index of the first core; and
- a second outer resin coat for covering the second inner resin coat, and an area adjacent to the fusion splice section contains a second resin-coat removed section in which the second outer resin coat and the second inner resin coat of the first optical fiber are removed.

11. A laser device employing the fiber component according to claim 10.

12. The fiber component according to claim 2, wherein a protective member for protecting the fusion splice section is disposed.

13. A laser device employing the fiber component according to claim 12.

14. The fiber component according to claim 8, wherein a protective member for protecting the fusion splice section is disposed.

15. A laser device employing the fiber component according to claim 14.

16. The fiber component according to claim 10, wherein a protective member for protecting the fusion splice section is disposed.

17. A laser device employing the fiber component according to claim 16.

* * * * *